US010570499B2

(12) United States Patent
Lin

(10) Patent No.: US 10,570,499 B2
(45) Date of Patent: Feb. 25, 2020

(54) MASK FRAME, A MASK FRAME MANUFACTURING METHOD AND A MASK

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Zhiming Lin, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 12 days.

(21) Appl. No.: 15/743,440

(22) PCT Filed: Jul. 13, 2017

(86) PCT No.: PCT/CN2017/092798
§ 371 (c)(1),
(2) Date: Jan. 10, 2018

(87) PCT Pub. No.: WO2018/107739
PCT Pub. Date: Jun. 21, 2018

(65) Prior Publication Data
US 2019/0078193 A1 Mar. 14, 2019

(51) Int. Cl.
*C23C 14/04* (2006.01)
*C23C 14/24* (2006.01)
(Continued)

(52) U.S. Cl.
CPC .......... *C23C 14/042* (2013.01); *B05C 21/005* (2013.01); *C23C 14/24* (2013.01); *H01L 51/001* (2013.01); *H01L 51/0011* (2013.01)

(58) Field of Classification Search
None
See application file for complete search history.

(56) References Cited

U.S. PATENT DOCUMENTS

| 2003/0108805 | A1* | 6/2003 | Clark | .................... C23C 14/042 430/22 |
| 2013/0199443 | A1* | 8/2013 | Kim | ........................ B05B 12/20 118/504 |
| 2015/0050767 | A1* | 2/2015 | Kuriyama | ............. C23C 14/042 438/34 |

FOREIGN PATENT DOCUMENTS

| CN | 3596762 B2 | 12/2004 |
| CN | 105839052 A | 8/2016 |

(Continued)

OTHER PUBLICATIONS

International Search Report dated Oct. 13, 2017 issued in corresponding International Application No. PCT/CN2017/092798 along with an English translation of the Written Opinion.

*Primary Examiner* — Jethro M. Pence
(74) *Attorney, Agent, or Firm* — Nath, Goldberg & Meyer; Joshua B. Goldberg; Daniel J. Bissing

(57) ABSTRACT

Disclosed are a mask frame, for mask frame manufacturing method and mask. The mask frame includes a main frame and shielding bars, an evaporation-deposition area penetrating the main frame in a thickness direction being formed on the main frame, the main frame being provided with pairs of first receiving slots, the two first receiving slots in each pair being located on both sides of the evaporation-deposition area in a first direction, respectively, each shielding bar corresponding to a pair of first receiving slot, two ends of shielding bars being disposed within corresponding two first receiving slots, respectively. The mask frame comprises at least one pair of first positioning holes, each pair of which corresponds to one pair of first receiving slots, and the two (Continued)

first positioning holes in each pair correspond to positions of the two first receiving slots in a corresponding pair, respectively.

16 Claims, 3 Drawing Sheets

(51) Int. Cl.
*H01L 51/00* (2006.01)
*B05C 21/00* (2006.01)

(56) References Cited

FOREIGN PATENT DOCUMENTS

| | | |
|---|---|---|
| CN | 105951041 A | 9/2016 |
| CN | 106086782 A | 11/2016 |
| CN | 106702318 A | 5/2017 |

\* cited by examiner

MASK FRAME, A MASK FRAME MANUFACTURING METHOD AND A MASK

CROSS-REFERENCE TO RELATED APPLICATION

This is a National Phase Application filed under 35 U.S.C. 371 as a national stage of PCT/CN2017/092798, filed on Jul. 13, 2017, an application claiming the priority of Chinese Patent Application No. 201611138902.7 filed on Dec. 12, 2016, titled "A MASK FRAME, A MASK FRAME MANUFACTURING METHOD AND A MASK" in the Chinese Intellectual Property Office, the disclosure of which is incorporated herein by reference.

FIELD OF THE INVENTION

The disclosure relates to the field of evaporation-deposition equipment, and in particular, to a mask frame, a method of manufacturing the mask frame, and a mask including the mask frame.

BACKGROUND OF THE INVENTION

In forming the organic light emitting diode display panel, the evaporation-deposition process is required. In the evaporation-deposition process, the use of the mask is necessary to form a specific pattern. In order to increase production efficiency, it is common to deposit on a large motherboard and then to divide the motherboard into a plurality of small array substrates. Correspondingly, the mask comprises a mask frame and a plurality of mask strips fixed on the mask frame. A plurality of through-holes can be formed in the mask strip. Evaporation-deposition material can be deposited on the motherboard through these through holes to obtain a corresponding pattern.

In order to ensure uniform stress on the mask strip and reduce wrinkles, through holes are also formed on the edge of the mask strip. However, in the process of the deposition of the material, a portion of the motherboard corresponding to the edge of the mask strip is not required to deposit the material. Therefore, a shielding bar is necessarily used to shield the edge of the mask strip.

SUMMARY OF THE INVENTION

Objectives of the disclosure are to provide a mask frame, a method of manufacturing the mask frame, and a mask including the mask frame.

In order to achieve above objectives, as one aspect, there is provided a mask frame. The mask frame includes a main frame and a plurality of shielding bars, an evaporation-deposition area penetrating the main frame in a thickness direction being formed on the main frame, the main frame being provided with a plurality of pairs of first receiving slots, the two first receiving slots in each of the pairs of first receiving slots being located on both sides of the evaporation-deposition area in a first direction, respectively, each of the shielding bars corresponds to one of the pairs of first receiving slot, two ends of the shielding bars are disposed within corresponding two first receiving slots, respectively, wherein the mask frame comprises at least one pair of first positioning holes, each pair of first positioning holes corresponds to one of the pairs of first receiving slots, and the two first positioning holes in each pair of first positioning holes correspond to positions of the two first receiving slots in corresponding one of the pairs of first receiving slots, respectively.

Preferably, the main frame is provided with a plurality of pairs of second receiving slots and a plurality of support bars, the two second receiving slots in each of the pairs of the second receiving slots is located on both sides of the evaporation-deposition area in a second direction, respectively, the second direction is perpendicular to the first direction, each of the support bars corresponds to one of the pairs of second receiving slots, and two ends of the support bars are disposed within corresponding two second receiving slots, respectively.

Preferably, the mask frame comprises at least one pair of second positioning holes, each pair of the second positioning holes corresponds to one of the pairs of the second receiving slots, and the two second positioning holes in each pair of second positioning holes corresponds to positions of the two second receiving slots in corresponding one of the pairs of second receiving slots, respectively.

Preferably, the main frame comprises: a frame body, which surrounds the evaporation-deposition area and on which the first receiving slots are formed; and an open mask, on which the first positioning hole and the second positioning hole are formed, wherein a third receiving slot surrounding the evaporation-deposition area is formed on the frame body, and the open mask is disposed within the third receiving slot.

Preferably, the main frame comprises: a frame body, which surrounds the evaporation-deposition area and on which the first receiving slots are formed; and two first positioning bars, on which a plurality of the first positioning holes are formed, wherein a fourth receiving slot is formed on each of sides of the evaporation-deposition area in the first direction, and the two first positioning bars are disposed within the two fourth receiving slots, respectively.

Preferably, the main frame further comprises two second positioning bars, on which a plurality of second positioning holes are formed, and the second receiving slots are formed on the frame body, wherein a fifth receiving slot is formed on each of sides of the evaporation-deposition area in the second direction, and the two second positioning bars are disposed within the two fifth receiving slots, respectively.

Preferably, the main frame includes a frame body which surrounds the evaporation-deposition area, and each of the first receiving slots, the second receiving slots, the first positioning holes and the second positioning holes is formed on the frame body.

Preferably, surfaces of the shielding bar and the support bar provided on the mask frame form a flat mounting surface.

As another aspect of the disclosure, there is provided a mask. The mask includes a mask frame and a plurality of mask strips, wherein the mask frame is the mask frame as set forth according to the disclosure, the plurality of mask strips are fixed on the main frame, a shielding bar is disposed between adjacent two mask strips, and an edge region of the mask strip is overlapped with the shielding bar.

As still another aspect of the disclosure, there is provided a method for manufacturing a mask frame, the mask frame comprising at least one pair of first positioning holes, the method comprising steps of:

providing a main frame and forming a plurality of pairs of first receiving slots in the main frame, wherein the two first receiving slots in each of the pairs of first receiving slots are located on both sides of an evaporation-deposition area in a first direction, respectively, each pair of first positioning holes corresponds to one of the pairs of the first receiving slots, and the two first positioning holes in each pair of first positioning holes correspond to positions of the two first receiving slots in corresponding one of the pairs of first receiving slots, respectively; and aligning the first receiving slot corresponding to the first positioning hole with a shielding bar with reference to the first positioning hole, and after an accurate alignment is completed, welding both ends of the shielding bar into the two first receiving slots in corresponding one of the pairs of first receiving slots, respectively.

Preferably, the mask frame comprises at least one pair of second positioning holes, each pair of which corresponds to one of the pairs of second receiving slots, and the two second positioning holes in each of the pairs of second positioning holes correspond to positions of the two second receiving slots in corresponding one of the pairs of second receiving slots, respectively, and the method further comprises a step of:

aligning the second receiving slot corresponding to the second positioning hole with a support bar with reference to the second positioning hole, and after an accurate alignment is completed, welding both ends of the support bar into the two second receiving slot in corresponding one of the pairs of second receiving slots, respectively.

In comparison to the sidewall edge of the first receiving slot, the edge of the first positioning hole is more definite and inclined to be identified. Even if the welding spot in the first receiving slot is polished when the damaged shielding bar is replaced, the boundary of the first positioning hole cannot be damaged. Therefore, when the shielding bar is positioned on the basis of the first positioning hole, the shielding bar can be accurately welded into the first receiving slot, so as to shield the edge portions of the mask strips disposed on the mask frame. In addition, since the shielding bars are precisely welded in place, it is possible to provide a large pre-offset amount for the design of the mask strip. Therefore, when the evaporation-deposition is performed using a mask plate including the mask frame, more accurate patterns can be formed on the base substrate.

BRIEF DESCRIPTION OF THE DRAWINGS

The accompanying drawings are provided to provide a further understanding of the present disclosure and constitute a part of the specification. The accompanying drawings, together with the following specific embodiments, are used to explain the present disclosure, but are not intended to limit the present disclosure. In the drawings:

FIG. 3*c* is a cross-sectional view taken along line III-III in FIG. 3*a.

DETAILED DESCRIPTION OF THE EMBODIMENTS

The specific embodiments of the present disclosure are described in detail below with reference to the accompanying drawings. It should be understood that, the specific embodiments described herein are provided only for the purpose of describing and explaining the present disclosure, and are not intended to limit the present disclosure.

Figure 1:
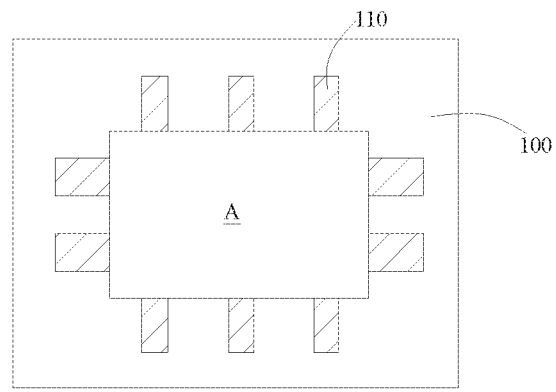
FIG. 1 is a schematic diagram of a main frame in a conventional mask frame.

FIG. 1 shows a schematic diagram of a main frame of a mask frame. As shown in FIG. 1, an evaporation-deposition area A penetrating the main frame 100 in a thickness direction is formed on the main frame. A plurality of pairs of first receiving slots 110 can be disposed on the main frame 100. The two first receiving slots 110 in each of the pairs of first receiving slots are located on both sides of the evaporation-deposition area A in a first direction (up and down direction in FIG. 1), respectively. In the embodiment shown in FIG. 1, three pairs of first receiving slots 110 are provided on the main frame. The first receiving slot is used for receiving both ends of the shielding bar. Specifically, two ends of the shielding bar are disposed within the two first receiving slots in pair, respectively.

First, the shading bar is necessarily aligned to the position of the receiving slot when being fixed. After an accurate alignment is completed, the shielding bar is welded into the receiving slots. In the alignment, a side wall of the receiving slot is usually used as an alignment reference. However, it is difficult to identify the side wall of the receiving slot, resulting in an inaccurate alignment. In addition, the mask may be damaged when the mask is used for a period of time. At this point, it is necessary to replace the shielding bar. During replacement, the damaged shielding bar needs to be removed, welding spots in the first receiving slot are polished, and then an undamaged shielding bar is weld thereto. However, polishing the welding spots within the first receiving slot is inclined to round the side walls of the first receiving slot, making it more difficult to identify.

Therefore, the accurate alignment of the shielding bar to the first receiving slot becomes a technical problem to be solved in the art.

As one aspect of the present invention, a mask frame is provided. As shown in FIG. 2, the mask frame includes a main frame 200 and a plurality of shielding bars (not shown). An evaporation-deposition area A penetrating the main frame in a thickness direction is formed in the main frame 200. The main frame 200 is provided with a plurality of pairs of first receiving slots. The two first receiving slots 210 in each of the pairs of first receiving slots are located on both sides of the evaporation-deposition area A in a first direction (up-down direction in FIG. 2), respectively. Each of the shielding bars corresponds to one of the pairs of first receiving slots. Two ends of the shielding bars are disposed within corresponding two first receiving slots 210, respectively. Herein, the mask frame includes at least one pair of first positioning holes 210*a*, each pair of which corresponds to one of the pairs of first receiving slots 210, and the two first positioning holes 210*a* in each pair of first positioning holes correspond to positions of the two first receiving slots in corresponding one of the pairs of first receiving slots, respectively.

When the shielding bar is welded, the first positioning hole 210*a* can be used as the alignment reference of the corresponding first receiving slot 210. Since the boundary of the first positioning hole 210*a* forms a closed pattern, the edge of the first positioning hole 210*a* is more inclined to be identified in comparison to the sidewall edge of the first receiving slot 210. In addition, the use of the first positioning hole 210a as the positioning reference can avoid the influence of the device accuracy on the welding accuracy and the damage on the identification boundary during the polishing and repairing. Therefore, the shielding bar can be accurately aligned with the first positioning hole 210a before the shielding bar is welded into the first receiving slot. In this way, it is possible to ensure that the shielding bar is precisely welded within the first receiving slot.

According to the embodiment of the present disclosure, when the shielding bar is damaged, the damaged shielding bar can be removed from the first receiving slot. During the polishing of the welding spot in the first receiving slot, the first positioning hole cannot be damaged. Therefore, when the shielding bar is replaced with a new one, the new shielding bar can still be positioned on the basis of the first positioning hole, so that the shielding bar can be accurately positioned and fixed onto the main frame.

Since the shielding bars are precisely welded within the first receiving slots, edge portions of the mask strips disposed on the mask frame can be shielded. In addition, since the shielding bars are precisely welded in place, it is possible to provide a large pre-offset amount for the design of the mask strip. Therefore, when the evaporation-deposition is performed using a mask plate including the mask frame, more accurate patterns can be formed on the base substrate.

Preferably, each pair of first receiving slots corresponds to a corresponding pair of the first positioning holes, such that all the shielding bars can be precisely positioned.

It is readily understood that when a display substrate is formed by the evaporation-deposition process, a pattern for forming a plurality of display substrates is usually evaporated and deposited onto a base substrate having a large area. Accordingly, a size of the main frame is required to correspond to the base substrate. In this case, a plurality of mask strips are welded to the main frame, and each of the mask strips has a certain sagging amount. In order to prevent the mask strip having an excessive large sagging amount, a transverse support is necessarily provided for the mask strip. Preferably, support bars may be provided on the main frame. The support bars can transversely support the mask strips to reduce the sagging amount of the mask strips, such that the mask strips are better fit to the substrate.

In addition to the supporting effect, the support bar can also be used to shield some of the through-holes in the mask strip.

Figure 2A:
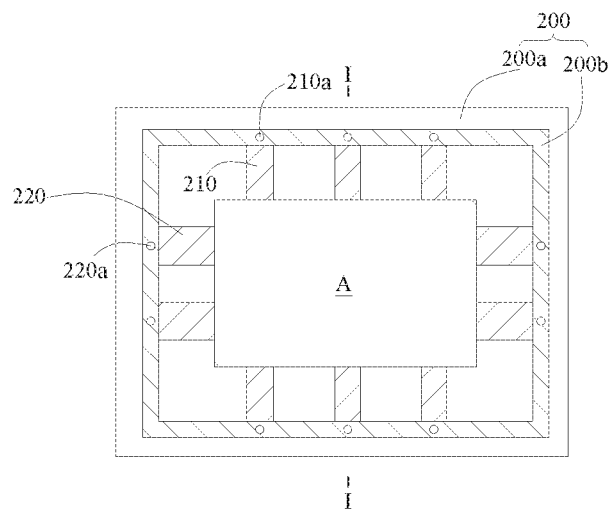
FIG. 2*a* is a schematic diagram showing in an example of a main frame in a mask frame according to one embodiment of the present disclosure.

Accordingly, as shown in FIG. 2a, a plurality of pairs of second receiving slots and a plurality of support bars are disposed on the main frame, and two second receiving slots 220 in each of the pairs of the second receiving slots are located on both sides of the evaporation-deposition area A in a second direction (left-right direction in FIG. 2), respectively, which is perpendicular to the first direction. Each of the support bars corresponds to one of the pairs of second receiving slots 220. Two ends of the support bars are disposed within corresponding two second receiving slots, respectively.

After the support strips are provided, the rigidity of the main frame can be increased to prevent the main frame from being deformed. In the meanwhile, the transverse support can be provided for the mask strips to prevent the mask strips from being deformed. In addition, an evaporation through-hole in a region of the mask strip overlapped with the support strip is shielded, so that the evaporation-deposition material cannot pass through the support bars to the base substrate, so that an interval can be formed between adjacent two display substrates. Therefore, the provision of the support bars also facilitates the formation of precise patterns on the base substrate through the evaporation-deposition process.

In order to accurately dispose the supporting bar into the second receiving slot, the mask frame preferably includes at least one pair of second positioning holes 220a, each pair of which corresponds to one of the pairs of second receiving slots 220, and the two second positioning holes in each pair of second positioning holes correspond to positions of the two second receiving slots in corresponding one of the pairs of second receiving slots, respectively.

Similar to the first positioning hole 210a, the boundary of the second positioning hole 220a is also obvious for convenience of identification, which facilitates the accurate alignment between the support bar and the second receiving slot 220. In addition, when the support bar is damaged, the damaged support bar can be detached to polish the welding spot within the second receiving slot. The second positioning hole 220a cannot be damaged during the polishing of the welding spot in the second receiving slot. When a new support bar is welded thereto, an accurate alignment can still be provided on the basis of the second positioning hole 220a.

In the embodiments of the disclosure, there is no particular limitation on the manner of forming the first positioning hole 210a and the second positioning hole 220a. For example, the first positioning hole 210a may be formed at a position corresponding to the first receiving slot 210 and the second positioning hole 220a may be formed at a position corresponding to the second receiving slot 220 during the processing of the main frame.

Alternatively, the first positioning hole 210a and the second positioning hole 220a may be disposed on an auxiliary frame, and then the auxiliary frame may be fixed to the main frame 200 such that the positions of the first positioning holes 210a are in consistency with the first receiving slots 210 and the positions of the second positioning holes 220a are in consistency with the second receiving slots 220.

In order to simplify the manufacturing process, the main frame 200 preferably includes a frame body 200a and an open mask 200b, as shown in FIG. 2a. The open mask 200b as described herein is similar to an open mask for evaporating and depositing a common layer and is commercially available. In this embodiment, the open mask itself has only one outer frame, and a size of its open area corresponds to the size of the evaporation-deposition area A. In addition, the open mask itself is provided with positioning holes. Therefore, the positioning holes on the open mask can be used as the first positioning holes and the second positioning holes.

As shown in FIG. 2a, the frame body 200a surrounds the evaporation-deposition area A. The first receiving slots 210 are formed on the frame body 200a. A third receiving slot surrounding the evaporation-deposition area A may also be formed on the frame body 200a, and the open mask 200b is disposed within the third receiving slot.

Since the third receiving slot is formed and the open mask 200b is disposed within the third receiving slot, the open mask 200b can be prevented from protruding from an upper surface of the frame body, so that the mask strips fixed to the frame body 200a become relatively smooth. In this way, the accuracy of the evaporation-deposition pattern can further be ensured.

Figure 2B:
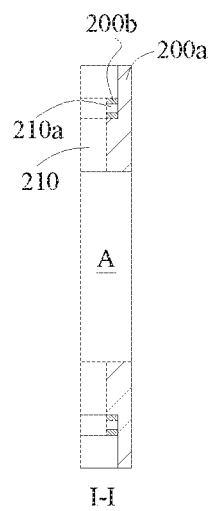
FIG. 2*b* is a cross-sectional view taken along line I-I in FIG. 2*a;*

FIG. 2b is a cross-sectional view taken along line I-I in FIG. 2a. As can be seen from FIG. 2b, the open mask 200b is disposed within the third receiving slot.

Figure 3A:
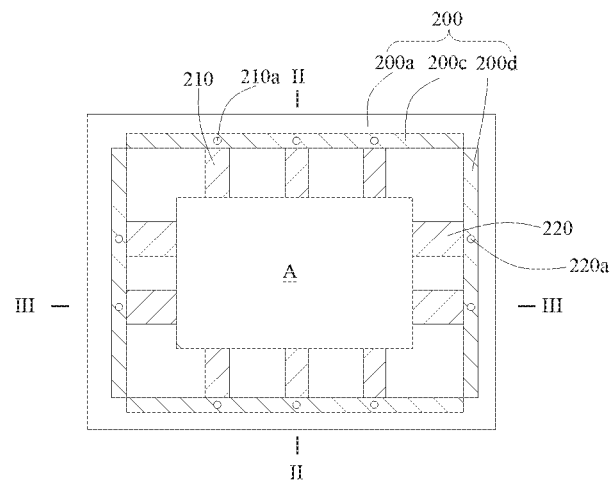
FIG. 3*a* is a schematic diagram of a main frame in a mask frame according to another embodiment of the present disclosure.

As another embodiment, as shown in FIG. 3a, the main frame 200 includes the frame body 200a, which surrounds the evaporation-deposition area A and on which the first receiving slots 210 are formed; and two first positioning bars 200c on which a plurality of first positioning holes 210a are formed. A fourth receiving slot is formed on each of sides of the evaporation-deposition area A in the first direction, and the two first positioning bars 200c are disposed within the two fourth receiving slots, respectively.

Figure 3B:
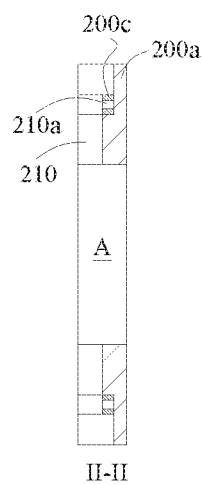
FIG. 3*b* is a cross-sectional view taken along line II-II in FIG. 3*a;*

FIG. 3b shows a cross-sectional view taken along line II-II in FIG. 3a. As can be seen from FIG. 3b, the first positioning bars 200c are disposed within the fourth receiving slots.

In the present disclosure, a portion of the open mask may be cut out to form the first positioning bar.

Preferably, the main frame further includes two second positioning bars 200d on which a plurality of second locating holes 220a are formed. The second receiving slots 220 are formed on the frame body 200a. A fifth receiving slot (not shown) is formed on each of sides of the evaporation-deposition area A in the second direction, and the two second positioning bars 200d are disposed within the two fifth receiving slots, respectively.

In the present disclosure, a portion of the open mask may be cut out to form the second positioning bar 200d.

Figure 3C:
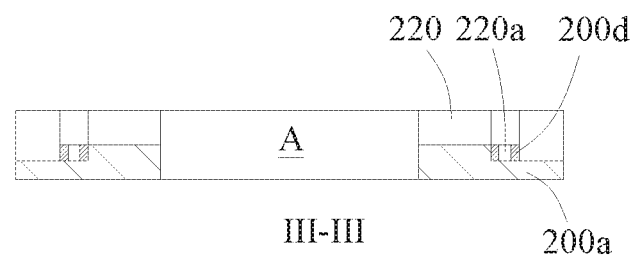

FIG. 3c shows a cross-sectional view taken along line III-III in FIG. 3a. As can be seen from FIG. 3c, the second positioning bars 200d are disposed within the fifth receiving slots.

In the embodiment shown in FIG. 3a, the open mask is cut into four sections to form two first positioning bars and two second positioning bars respectively.

In a specific embodiment according to the present disclosure, a depth of each of the third receiving slot, the fourth receiving slot and the fifth receiving slot is greater than a depth of the first receiving slot and is also greater than a depth of the second receiving slot.

As another embodiment of the present invention, the first positioning hole and the second positioning hole may be processed directly on the frame body. Specifically, the main frame includes the frame body which surrounds the evaporation-deposition area and on which the first receiving slot, the second receiving slot, the first positioning hole and the second positioning hole are formed.

In order to prevent the surface of the mask strip from being uneven, it is preferable that neither the surface of the shielding bar nor the support bar is higher than the surface of the main frame. Specifically, a thickness of the shielding bar may be less than or equal to a depth of the first receiving slot, and a thickness of the support bar is less than or equal to a depth of the second receiving slot.

Figure 4:
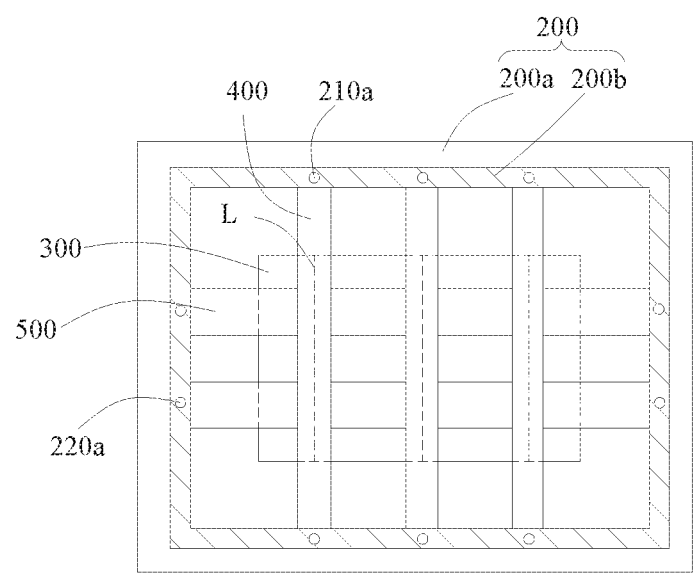
* and FIG. 4 is a schematic structural diagram of the mask provided according to the present disclosure.

As a second aspect of the present invention, there is provided a mask. As shown in FIG. 4, the mask includes a mask frame and a plurality of mask strips 300. The mask frame is the mask frame as set forth according to the present disclosure. The plurality of mask strips 300 are fixed on the main frame, and a shielding bar 400 is disposed between adjacent two mask strips 300 such that an edge portion of the mask strip 300 is overlapped with the shielding bar 400.

In the present disclosure, through-holes are formed on the edge portion of the mask strip 300 allowing for a uniform stress distribution on the mask strip to avoid deformation or the like.

As described above, since the mask frame is provided with the first positioning holes corresponding to the first receiving slots, the shielding bars 400 can be accurately positioned in the respective first receiving slots. After the shielding bar 400 is precisely positioned, the evaporation-deposition material passing through the through-holes in the peripheral region can be effectively prevented from being deposited on the base substrate to be processed, so that the accuracy of the pattern formed on the base substrate can be improved.

In FIG. 4, the dashed line L represents an intersection line between adjacent two mask strips 300.

Since the mask frame is provided with second positioning holes corresponding to the second receiving slots, the support bars 500 can be accurately positioned in the precisely second receiving slots.

Since the support bar and the shielding bar in the mask are accurately positioned, the gap between the mask strips can be accurately blocked, so that an accurate pattern can be formed on the base substrate.

As a further aspect of the present disclosure, there is provided a method for manufacturing a mask frame, the mask frame including at least one pair of first positioning holes, the method comprising:

providing a main frame and forming a plurality of pairs of first receiving slots in the main frame, wherein the two first receiving slots in each of the pairs of first receiving slots are located on both sides of an evaporation-deposition area A in a first direction, respectively, each pair of first positioning holes corresponds to one of the pairs of the first receiving slots, and the two first positioning holes in each pair of first positioning holes correspond to positions of the two first receiving slots in corresponding one of the pairs of first receiving slots, respectively; and aligning the first receiving slot corresponding to the first positioning hole with a shielding bar with reference to the first positioning hole, and after an accurate alignment is completed, welding both ends of the shielding bar into the two first receiving slots in corresponding one of the pairs of first receiving slots, respectively.

As described above, since the boundary of the first positioning hole 210a forms a closed pattern, the edge of the first positioning hole 210a is more inclined to be identified in comparison to the sidewall edge of the first receiving slot 210. In addition, the use of the first positioning hole 210a as a positioning reference can avoid the influence of the device accuracy on the welding accuracy and the damage on the identification boundary during the polishing and repairing. Therefore, the shielding bar can be accurately aligned with the first positioning hole 210a before the shielding bar is welded into the first receiving slot 210. In this way, it is possible to ensure that the shielding bar is precisely welded within the first receiving slot.

According to the embodiment of the present disclosure, when the shielding bar is damaged, the damaged shielding bar can be removed from the first receiving slot. During the polishing of the welding spot in the first receiving slot, the first positioning hole cannot be damaged. Therefore, when the shielding bar is replaced with a new one, the new shielding bar can still be positioned on the basis of the first positioning hole, so that the shielding bar can be accurately positioned and fixed onto the main frame.

Since the shielding bars are precisely welded within the first receiving slots, edge portions of the mask strips disposed on the mask frame can be shielded. In addition, since the shielding bars are precisely welded in place, it is possible to provide a large pre-offset amount for the design of the mask strip. Therefore, when the evaporation-deposition is performed using a mask plate including the mask frame, more accurate patterns can be formed on the base substrate.

When the mask frame has a relatively large size, a support bar necessarily provided to support the mask strip. In this case, the mask frame includes at least one pair of second positioning holes, each pair of which corresponds to one of the pairs of second receiving slots, and the two second positioning holes in each of the pairs of second positioning holes correspond to positions of the two second receiving slots in corresponding one of the pairs of second receiving slots, respectively. The method further comprises:

aligning the second receiving slot corresponding to the second positioning hole with a support bar with reference to the second positioning hole, and after an accurate alignment is completed, welding both ends of the support bar into the two second receiving slot in corresponding one of the pairs of second receiving slots, respectively.

Similar to the first positioning hole, the boundary of the second positioning hole is also obvious for convenience of identification, which facilitates the accurate alignment between the support bar and the second receiving slot. In addition, when the support bar is damaged, the damaged support bar can be detached to polish the welding spot within the second receiving slot. The second positioning hole cannot be damaged during the polishing of the welding spot in the second receiving slot. When a new support bar is welded thereto, an accurate alignment can still be provided on the basis of the second positioning hole.

It can be understood that the above embodiments are merely exemplary embodiments provided for illustrating the principle of the present disclosure. However, the disclosure is not limited thereto. For those skilled in the art, various modifications and improvements may be made without departing from the spirit and essence of the present disclosure, and these modifications and improvements are also considered as the protection scope of the disclosure.

The invention claimed is:

1. A mask frame, comprising a main frame and a plurality of shielding bars, an evaporation-deposition area penetrating the main frame in a thickness direction being formed on the main frame, the main frame being provided with a plurality of pairs of first receiving slots, the two first receiving slots in each of the pairs of first receiving slots being located on both sides of the evaporation-deposition area in a first direction, respectively, each of the shielding bars corresponding to one of the pairs of first receiving slot, two ends of the shielding bars being disposed within corresponding two first receiving slots, respectively, wherein the mask frame comprises at least one pair of first positioning holes, each pair of the first positioning holes corresponds to one of the pairs of first receiving slots, two first positioning holes in each pair of the first positioning holes correspond to positions of the two first receiving slots in a corresponding one of the pairs of first receiving slots, respectively, and the plurality pairs of first receiving slots are configured to receive the two ends of the shielding bars, the two ends of each of the shielding bars are welded into the two first receiving slots in a corresponding one of the pairs of first receiving slots, respectively.

2. The mask frame according to claim 1, wherein the main frame is provided with a plurality of pairs of second receiving slots and a plurality of support bars, two second receiving slots in each of the pairs of the second receiving slots is located on both sides of the evaporation-deposition area in a second direction, respectively, the second direction is perpendicular to the first direction, each of the support bars corresponds to one of the pairs of second receiving slots, and two ends of the support bars are disposed within corresponding two second receiving slots, respectively.

3. The mask frame according to claim 2, wherein the mask frame comprises at least one pair of second positioning holes, each pair of the second positioning holes corresponds to one of the pairs of the second receiving slots, and the two second positioning holes in each pair of second positioning holes corresponds to positions of the two second receiving slots in corresponding one of the pairs of second receiving slots, respectively.

4. The mask frame according to claim 3, wherein the main frame comprises:

a frame body, which surrounds the evaporation-deposition area and on which the first receiving slots are formed; and an open mask, on which the first positioning hole and the second positioning hole are formed, wherein a third receiving slot surrounding the evaporation-deposition area is formed on the frame body, and the open mask is disposed within the third receiving slot.

5. The mask frame according to claim 3, wherein the main frame comprises:

a frame body, which surrounds the evaporation-deposition area and on which the first receiving slots are formed; and two first positioning bars, on which a plurality of the first positioning holes are formed, wherein a fourth receiving slot is formed on each of sides of the evaporation-deposition area in the first direction, and the two first positioning bars are disposed within the two fourth receiving slots, respectively.

6. The mask frame according to claim 5, wherein the main frame further comprises two second positioning bars, on which the at least one pair of second positioning holes are formed, and the plurality of pairs of second receiving slots are formed on the frame body, wherein a fifth receiving slot is formed on each sides of the evaporation-deposition area in the second direction, and the two second positioning bars are disposed within the two fifth receiving slots, respectively.

7. The mask frame according to claim 3, wherein the main frame includes a frame body which surrounds the evaporation-deposition area, and each of the first receiving slots, the second receiving slots, the first positioning holes and the second positioning holes is formed on the frame body.

8. The mask frame according to claim 2, wherein a thickness of one of the plurality of shielding bar is less than or equal to a depth of one of the first receiving slots of one of the pairs of the plurality of first receiving slots, and a thickness of one of the plurality of support bars is less than or equal to a depth of the second receiving slot.

9. A mask, comprising a mask frame and a plurality of mask strips, wherein the mask frame is the mask frame according to claim 1, the plurality of mask strips are fixed on the main frame, a shielding bar is disposed between adjacent two mask strips, and an edge region of the mask strip is overlapped with the shielding bar.

10. The mask according to claim 9, wherein
the main frame is provided with a plurality of pairs of second receiving slots and a plurality of support bars,
the two second receiving slots in each of the pairs of the second receiving slots is located on both sides of the evaporation-deposition area in a second direction, respectively,
the second direction is perpendicular to the first direction,
each of the support bars corresponds to one of the pairs of second receiving slots, and
two ends of the support bars are disposed within corresponding two second receiving slots, respectively.

11. The mask according to claim 10, wherein
the mask frame comprises at least one pair of second positioning holes,
each pair of the second positioning holes corresponds to one of the pairs of the second receiving slots, and
the two second positioning holes in each pair of second positioning holes corresponds to positions of the two second receiving slots in corresponding one of the pairs of second receiving slots, respectively.

12. The mask according to claim 11, wherein the main frame comprises:
a frame body, which surrounds the evaporation-deposition area and on which the first receiving slots are formed; and
an open mask, on which the first positioning hole and the second positioning hole are formed, wherein
a third receiving slot surrounding the evaporation-deposition area is formed on the frame body, and
the open mask is disposed within the third receiving slot.

13. The mask according to claim 11, wherein the main frame comprises:
a frame body, which surrounds the evaporation-deposition area and on which the first receiving slots are formed; and
two first positioning bars, on which a plurality of the first positioning holes are formed, wherein
a fourth receiving slot is formed on each of sides of the evaporation-deposition area in the first direction, and
the two first positioning bars are disposed within the two fourth receiving slots, respectively.

14. The mask according to claim 13, wherein
the main frame further comprises two second positioning bars, on which a plurality of second positioning holes are formed, and
the second receiving slots are formed on the frame body, wherein
a fifth receiving slot is formed on each of sides of the evaporation-deposition area in the second direction, and
the two second positioning bars are disposed within the two fifth receiving slots, respectively.

15. The mask according to claim 11, wherein
the main frame includes a frame body which surrounds the evaporation-deposition area, and
each of the first receiving slots, the second receiving slots, the first positioning holes and the second positioning holes is formed on the frame body.

16. The mask according to claim 10, wherein
a thickness of the shielding bar is less than or equal to a depth of the first receiving slot, and
a thickness of the support bar is less than or equal to a depth of the second receiving slot.

* * * * *